US007997495B2

(12) United States Patent
Rodgers

(10) Patent No.: US 7,997,495 B2
(45) Date of Patent: Aug. 16, 2011

(54) PRECISELY TUNED RFID ANTENNA

(76) Inventor: James Neil Rodgers, Langley (CA)

( * ) Notice: Subject to any disclaimer, the term of this patent is extended or adjusted under 35 U.S.C. 154(b) by 1188 days.

(21) Appl. No.: 11/686,946

(22) Filed: Mar. 15, 2007

(65) Prior Publication Data

US 2008/0224874 A1 Sep. 18, 2008

(51) Int. Cl.

| | |
|---|---|
| ***G06K 7/00*** | (2006.01) |
| ***G06K 19/06*** | (2006.01) |
| ***G08B 13/14*** | (2006.01) |
| ***G03F 7/00*** | (2006.01) |
| ***G01R 31/26*** | (2006.01) |

(52) U.S. Cl. ..................... 235/482; 235/435; 340/572.1; 430/311; 438/14; 438/942

(58) Field of Classification Search .................. 235/435, 235/492; 340/572.1; 438/14, 942; 430/311
See application file for complete search history.

(56) References Cited

U.S. PATENT DOCUMENTS

| | | | | |
|---|---|---|---|---|
| 7,095,372 | B2 | 8/2006 | Soler Castany et al. | |
| 2004/0085190 | A1 * | 5/2004 | Tuttle et al. | 340/10.1 |
| 2006/0066441 | A1 * | 3/2006 | Knadle et al. | 340/10.1 |
| 2006/0290473 | A1 * | 12/2006 | Mahasenan et al. | 340/10.2 |

* cited by examiner

*Primary Examiner* — Michael G Lee
*Assistant Examiner* — Laura Gudorf
(74) *Attorney, Agent, or Firm* — James Neil Rodgers

(57) ABSTRACT

The present invention describes An RFID antenna manufacturing system whereby the RFID antenna becomes an integral part of an integrated circuit package. The RFID manufacturing system contemplated by this invention includes photoresist manufacturing techniques to produce a template or die specifically designed to mass produce RFID transponders whereby the chip and antenna becomes one integrated unit. The RFID antenna template or die is precisely tuned, using trimming algorithms and laser technology, to resonate with electro magnetic signal increments of 2 megahertz. According to this system each electro magnetic signal increment is assigned to a different category in a supply chain. This invention reduces the cost, size and weight of prior art RFID transponders. This invention reduces signal to noise ratio by producing precisely tuned antennas which provide a gatekeeper function directly correlated to ambient electro magnetic signals.

11 Claims, 4 Drawing Sheets

ANTENNA: Designed, Photographed, De-magnified and Template(die) Constructed

DRAWING 1: PREPARATION of SILICON LAYERS
Doping with Aluminum or Copper Plus Laser Ablation all to increase electromagnetic sensitivity to radio frequency signal frequency
(A)Silicon Layer for Antennas
(Laser forms microscopic 3D ruts)
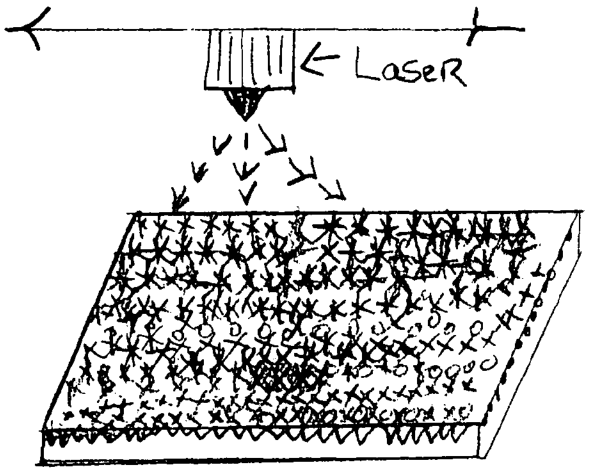
(B) Silicon layer for Integrated Circuit(IC)
(Laser forms microscopic 3D ruts)
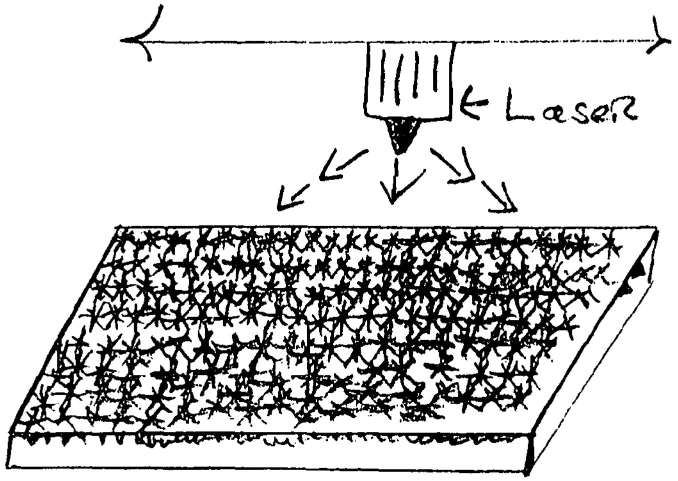

DRAWING 2: PREPARATION of INTEGRATED CIRCUIT
( Using a Doped and laser ablated Silicon layer)
Step 1: Constructing a multiple template (die) for I.C.
Step 2: Laser light etch and deposit
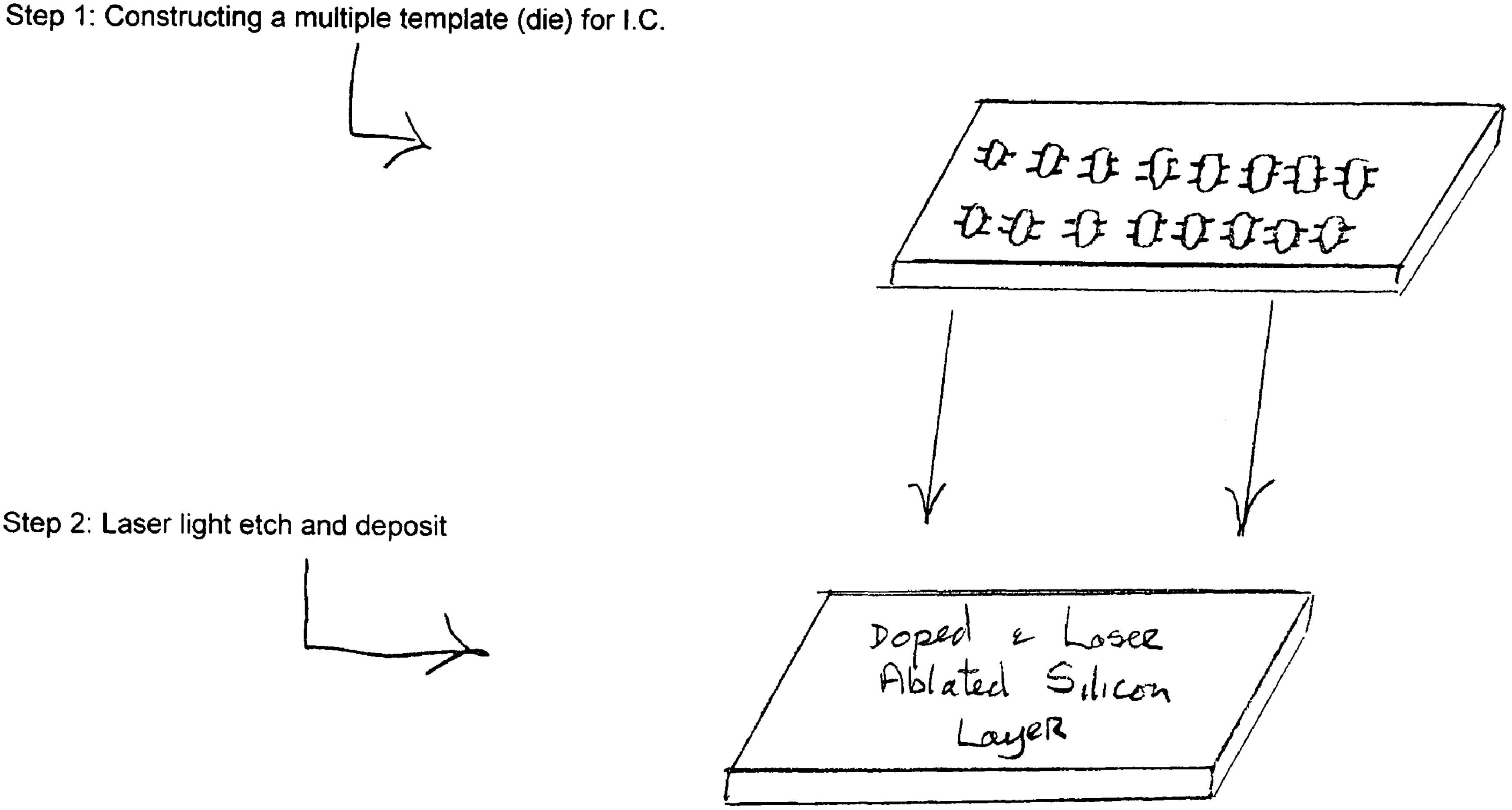

DRAWING 3: ANTENNA: Designed, Photographed, De-magnified and Template(die) Constructed
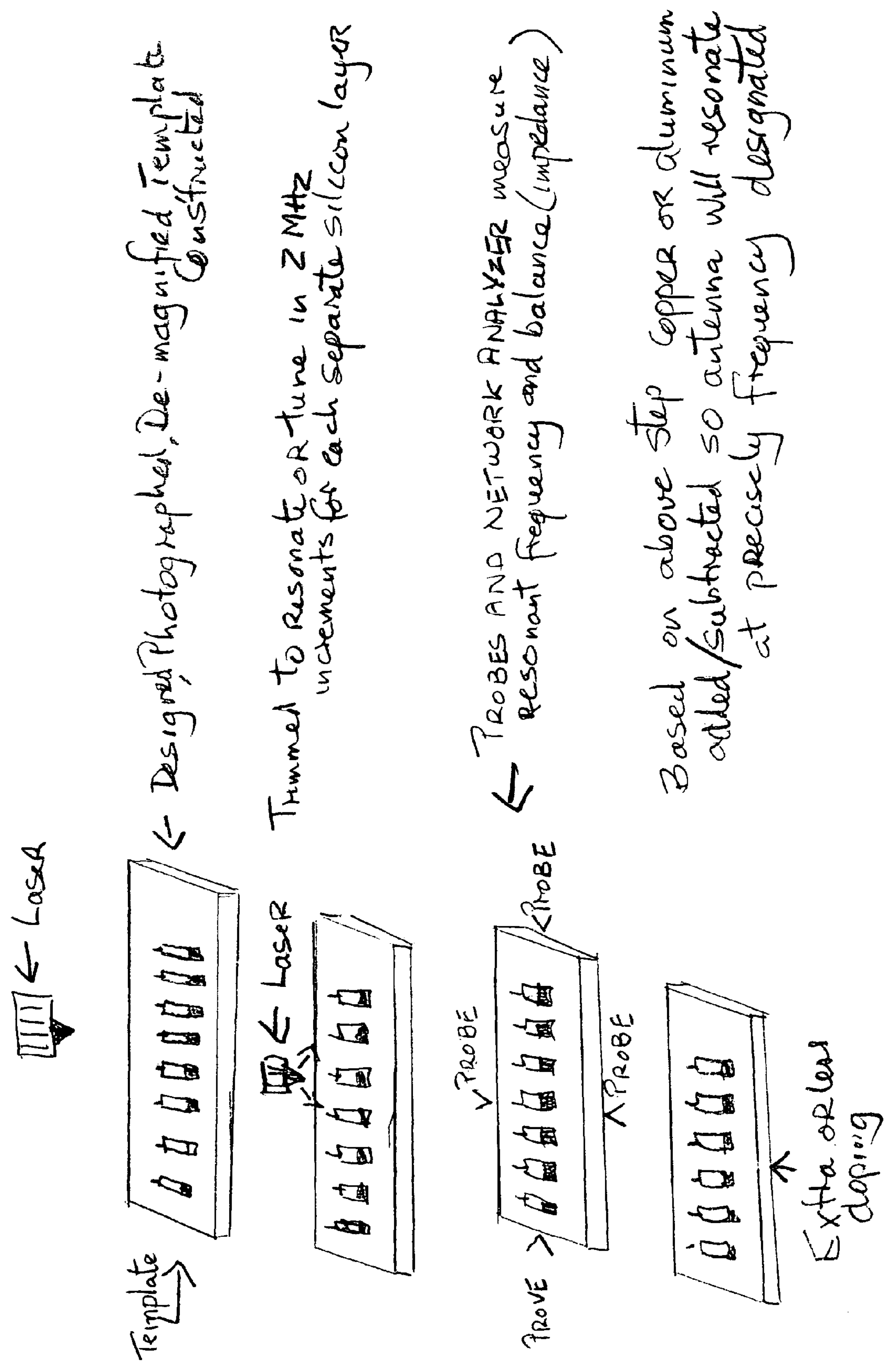

DRAWING 4: Manufacture of Multiple Precisely Tuned Antennas
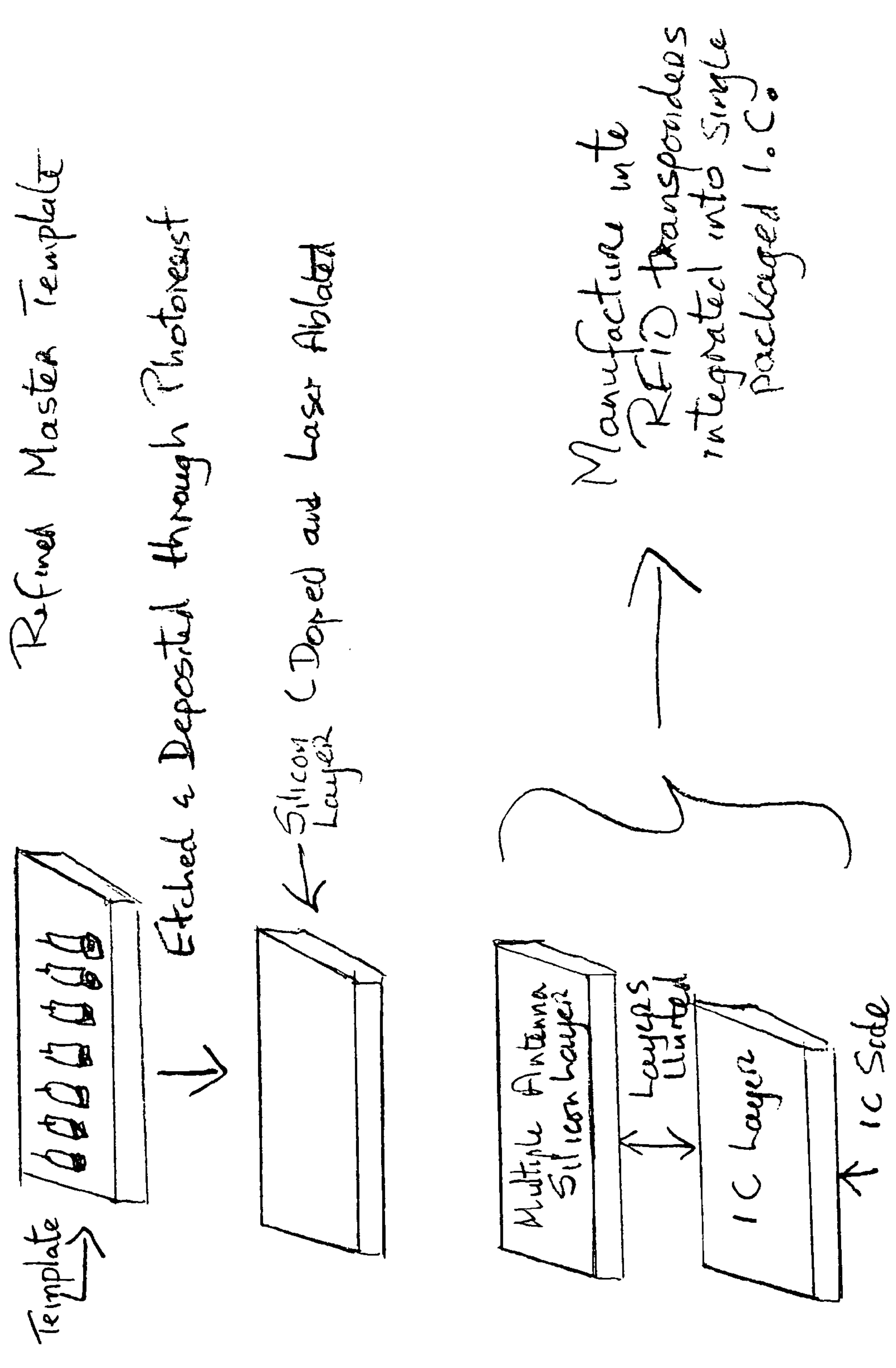

PRECISELY TUNED RFID ANTENNA

CROSS REFERENCE TO RELATED APPLICATIONS

Rodgers' Application Ser. No. 11,683,056, "RFID Silicon Antenna"

Rodgers Application Ser. No. 11,678,063, "External Antenna for RFID Remote Interrogation"

Rodgers Application Ser. No. 11,672,525, "RFID Environmental Manipulation"

STATEMENT REGARDING FEDERALLY SPONSOR RESEARCH OR DEVELOPMENT

None

THE NAMES OF THE PARTIES TO A JOINT RESEARCH AGREEMENT

N/A

BACKGROUND OF THE INVENTION

1. Field of the Invention

The field of the invention is Radio Frequency Identification (RFID) and details an RFID precisely tuned antenna manufacturing method whereby the RFID antenna becomes an integral part of a nano sized integrated circuit package. The RFID manufacturing system contemplated by this invention includes photoresist manufacturing techniques to produce a template or die specifically designed to mass produce RFID transponders whereby the chip and antenna becomes one integrated unit. The RFID antenna template or die is precisely tuned, using trimming algorithms and laser technology, to resonate with electro magnetic signal increments of 2 megahertz. This invention reduces signal to noise ratio by producing precisely tuned antennas which provide a gatekeeper function directly correlated to ambient electro magnetic signals.

2. Description of Related Art

The current state of the art in RFID chip manufacture is represented by Hitachi. RFID chips manufactured by Hitachi are 0.002 inches by 0.002 inches, in other words, the thickness of a piece of paper. These chips resemble a tiny bit of powder yet they can handle the same amount of data as a chip sixty times that size. The data is stored as a 38 digit number. These chips do not contain an external antenna. If this chip did have an external antenna by using current manufacturing methods the external antenna would be much larger than the chips whose signals it would broadcast. For example the chips which use attached antenna use the smallest antenna in the current RFID arsenal which is about 0.16 inches, far larger than the chip itself. The Hitachi chip has yet to find an antenna to compliment its size. In other words, it is a chip without an antenna from which to receive or broadcast its data.

A study by Leisten et. al. titled "Laser Assisted Manufacture for Performance Optimised, Dielectrically Loaded GPS Antennas for Mobil Telephones" sponsored in part by Loughborough University indicates that laser technology is critical to producing precise antenna components. This study underscores the fact that novel laser imaging technology using a positive electrophoretic photoresist and UV eximer laser mask has been developed to produce precise conducting features on the surface of an antenna. During the research a laser trimming technique is tested using trimming algorithms to machine the antennas to operate at precisely 1572.42 MHz, the designated test frequency. The goal was to trim the antenna to within a tolerance of 2 MHz. The trimming was required despite the excellent accuracy which can be achieved with laser imaging of the original antenna pattern. Trimming is necessary as a consequence of the spread in antenna dimensions, dielectric properties to the ceramic core material of the antenna plus copper thickness and resistivity. The antenna trimming was carried out with a fundamental mode Nd:YAG laser in TEM00 mode, resulting in a small laser spot size. The laser beam is focused onto the antenna by means of a flat field (f-theta) lens, and scanned across the top surface of the antenna by means of an x-y galvanometer in order to ablate small areas of copper.

The laser trimming tool is integrated in a robotic assembly loop which fits the matching boxes to the antennas. A pick and place robot picks up an antenna with fitted matching box and places this in a pneumatically actuated chuck on a high speed linear stage which moves the antenna into the laser safe trimming tool enclosure through a pneumatically operated door. Once in the trimming position, four RF probes mounted radially around the antenna are moved to close proximity of the antenna perimeter such that each probe is located at the base of the antenna. The resonant frequency and balance (impedance) of the antenna is measured with the probes and a network analyzer, with specially developed trimming algorithms, determines the amount of copper (if any) needed to be removed from each of the antenna pattern. After the trimming operation, the antenna was again measured with the RF probes and either accepted or rejected pursuant to the tolerance limits of 2 MHz. All accepted antennas are marked with a unique data code that is produced with the same trimming laser. The research concluded that laser technology can fulfill a critical role in the high volume manufacture of small antennas. The research does not contemplate the use of lasers to fine tune an ultra small antenna for transmissions within very narrow ranges to resonant with individual items located in a supply chain or within a warehouse, distribution center or retail environment.

In a study by Penn et al. titled "Development of a 24- to 44-Gigahertz (Ka-band) Vector Modulator Monolithic Microwave Integrated Circuit (MMIC)" the authors conducted research into development of a transponder capable of supporting high data rates of hundreds of Mb/s. Applications considered by the research were Mars missions, lunar missions, astronaut video and high definition television. The research parameters included the need to simplify the transponder hardware by modulating directly at Ka-band. The researchers developed a low power high modulation bandwidth vector modulator under the Mars Advanced Technology Program for Ka-band operation. Their design is capable of space applications from 24 to 44 GHz. It was developed for a transponder operating at the 32 GHz level. This research demonstrates the viability of transponders in the 24 to 44 GHz range but does not contemplate the use of same for ultra small antenna transmission in a supply chain or warehouse, distribution center or retail type of environment.

Fractus, a pioneer developer of the fractal antenna technology, has set a new benchmark for miniaturization. Its smallest antenna is designed for the ISM 2.4 GHz band. The 3.7 mm by 2 mm Micro Reach Xtend antenna is the size of a single grain of rice. This provides device designers with significantly more available space to enable new multimedia applications for such things as Bluetooth headsets and mobile handsets. This use of fractal geometry for an extremely economical use of space is presented by Fractus at a reduced cost; however, it does nothing in terms of providing an on chip antenna for the new dust sized chips. It is simply too big. U.S. Pat. No.

7,095,372 assigned to Fractus, S. A. relates to an integrated circuit package which comprises a substrate which includes an antenna. In the Fractus system miniaturization is accomplished through implanting a series of five segments with at least three of the segments being shorter than one-tenth of the longest free space operating wavelength of the antenna. Furthermore each of the four pairs of angles between sections is to have angles of less than 180 degrees. The Fractus invention allows for a high package density, including the antenna, within the chip. The antenna comprises a conducting pattern at least a portion of which includes a curve of at least five segments. This invention does not contemplate etching a precisely tuned antenna unto silicon as a process of miniaturization.

The present invention piggy backs on the current trend in the semiconductor industry towards System on Chip (SoC) and System on Package (SoP) concepts. These concepts refer to putting all items necessary for chip operation within the chip itself. This invention relates to the RFID industry in particular and its requirements for a miniature antenna to form an integral part of the transponder item found in a complete RFID system. Through integration of the antenna, processors, memories, logic gates and biasing circuitry into a single semiconductor chip, the manufacturing process outlined herein details commercial transponder advantages of size, weight and cost. In other words, by manufacturing the antenna as part of the chip and not by attaching an external antenna, the cost decreases as does the size and weight of the RFID transponder. Furthermore, the present invention borrows from Gen 2 cellular telephony designs by incorporating a frequency division concept into this novel RFID transponder formula.

BRIEF SUMMARY OF THE INVENTION

The useful, non-obvious and novel steps of this invention are described in a system to manufacture an RFID antenna using existing manufacturing techniques normally employed in the integrated circuit industry. These techniques include photo reduction and laser trimming methodologies. Furthermore, these techniques allow for an antenna design which will resonate precisely with an RFID interrogator at a predetermined frequency. The utility of this invention is that the RFID transponder antenna can be manufactured so that a precise antenna length can be designed in template form and photographically reduced. This photographic reduction is then etched into silicon. A silicon layer is then produced which is applied to a silicon substrate. Using this process a different, but very precise antenna length, can be designed for every RFID transponder and integrated into one package containing chip and antenna. According to this invention the antenna length is designated to match each category of traceable article carried by an RFID end user. For example, the transponder for the category “television set” can resonate at 24.00 GHz and a transponder for the category “radio” can resonate at 24.02 GHz and a transponder for a the category “CD player” can resonate at 24.04 GHz, and so forth. A further utility of this invention is that the antenna can be manufactured at a scale that will allow it to be the size of a piece of dust. Moreover, the antenna is the most expensive part of an RFID transponder. The packaging of chip and antenna in one integrated package dramatically reduces the cost of the RFID transponder. Furthermore, this invention reduces the size and weight of the RFID transponder by integrating chip and antenna into one integrated package. This invention also reduces signal to noise ratio by providing a gatekeeper function in relation to ambient electro magnetic signals.

BRIEF DESCRIPTION OF THE SEVERAL VIEWS OF THE DRAWINGS

Drawing 1: Preparation of Silicon Layers: Illustrates doping of silicon with copper or aluminum and laser ablation all to increase the electromagnetic sensitivity of the silicon to radio frequency signal sensitivity.

Drawing 2: Preparation of an Integrated Circuit: Illustrates the construction of a Template(Die) and the laser light etching and depositing of this into the doped and laser ablated silicon layer referenced in Drawing 1.

Drawing 3: Design of the Antenna which is then Photographed, De-magnified and a Template constructed there from. Template tested for precise frequency required and copper or aluminum added or removed as necessary Drawing 4: Manufacture of Multiple Precisely Tuned Antennas from the doped and laser ablated silicon layer in Drawing 1 and Designed, Photographed and De-magnified as per Drawing 3 and which are then united with the IC Silicon layer to form one nano sized integrated circuit package.

DETAILED DESCRIPTION OF THE INVENTION

This inventive RFID manufacturing system is based on the radio frequency principle that an antenna needs to radiate and receive electro magnetic signals. This is done most efficiently when the length of the antenna precisely matches the wavelength of the transmitted radio frequency. There is a mathematical formula used to determine the proper length of an antenna. The formula states that wavelength in feet is equal to 984 over the frequency in megahertz. For example, a signal broadcast at 25.01 megahertz would need a full wavelength antenna measuring 39.34 feet. This is calculated through dividing 984 by 39.34. The result is 25.012709.

The compromise built into antenna design is to manufacture an antenna so that it is a fraction of the full wavelength. Common examples are one half, five eighths, one quarter or one eight size of the antenna in relationship to the full wavelength formula.

To determine if the compromise is reliable the antenna designers need to measure the Standing Wave Ratio, known as the SWR. This is done by using commercial devices to make a measurement between the antenna and cable feed. The SWR is important because each antenna and each antenna cable generates a specific impedance characteristic. Impedance is an opposing reaction to electrical current. In a perfectly tuned system, the antenna will radiate one hundred percent of the electrical energy sent via the cable connection. In a situation where the impedances are not matched the result is that some of the energy will not be converted to electro magnetic signal and will be reflected back down the cable feed line. The energy reflected back causes standing waves of electrical energy. The ratio of the highest voltage on the line to lowest is the standing wave ratio. In a perfectly matched system the SWR is 1:1.

The SWR is used to tune the antenna by placing an SWR meter between the transmitter and the feed line. If the SWR does go above 1.5:1 a radio engineer will watch the SWR meter on different frequencies to view the trend. The SWR will either be greater on the higher or lower channels. If the SWR is greater on the lower channels then a lengthening of the antenna is required. If the SWR is greater on the higher channels then a shortening of the antenna is in order.

In a standard RFID system radio frequency transmissions are mandated at the 860 to 960 MHz range and at the 13.56 MHz center frequency. Instead of developing an RFID transponder antenna which corresponds to each exact frequency, antenna designers compromise and pick a frequency in the middle of the spread. For example, at the 910 MHz midpoint of the 860 to 960 MHz frequency spectrum. The antenna is manufactured at the proper length to resonate with this mid spectrum frequency.

Typically, in tuning an antenna, the antenna is tuned to a resonance at the center frequency in which the RFID system in question operates. This is accomplished by matching a combination of the inductance and capacitance of the circuit. In a tuned circuit, such as a radio receiver, the frequency selected is a function of the inductance and the capacitance in series. This is the frequency at which resonance occurs in the circuit.

In a typical RFID system the RFID antenna is broadly tuned so that sidebands, caused by the data signals being modulated onto the center frequency carrier wave, can fit into the band pass of the antenna. If the antenna is tuned too narrowly the sidebands will be cut off and lost. If the antenna is tuned very widely than the sidebands will pass through; however, so will random ambient noise which also occurs in that frequency range. Too much noise increases signal to noise ratio thereby reducing efficiency.

Another aspect of RFID antenna tuning is to consider a wide range of environmental factors. For example, the transponder may be in an environment with liquids and metals which could detune the antenna. To compensate for environmental factors the antenna is usually detuned further to accommodate the widest bandwidth possible. The parameter which describes the relative bandwidth is known as “Q”. This stands for quality factor. In summary, the three most important factors in present day design of an RFID antenna are; 1.) matching input impedance, 2.) ensuring that there is center frequency resonance and, 3.) designing sufficient bandwidth “Q”. As mentioned, matching impedance means to tune the various resonance circuits and matching networks for maximal power transfer. This first item relates, in the main, to the interrogator side of a standard RFID system. Item two and three relate to the antenna on the transponder side of the equation. The thrust of this invention is to describe a system whereby the transponder antenna can be reduced to the size of a piece of dust and can be tuned to an exact frequency by accurately measuring and trimming antenna length. This precise frequency tuning allows for a different antenna length for each product category in a supply chain. Therefore, precise readings will be made on each item in the category. Pursuant to this invention an incrementally different frequency will be assigned for each category of items to be tracked. On the interrogator side this invention contemplates an interrogator which is designed to resonate with these specific frequencies as required by the operator of the RFID system or by the operating software.

This invention contemplates that the RFID antenna is to be manufactured using the same silicon etching process as the integrated circuit which houses the RFID antenna. Using this integrated circuit manufacturing process the antenna can fit within the chip itself. The antenna and chip becomes one integrated unit instead of the antenna being attached to the chip. In other words, by drafting a mock up of a perfect antenna and then photographing it and then de-magnifying same, one can manufacture an unlimited amount of identical and precisely tuned antennas from the initial template and integrate this antenna as part of the silicon. The antennas will be made of silicon with aluminum or copper impurities introduced into the circuitry as doping agents. Rodgers’ application Ser. No. 11,683,056, “RFID silicon antenna” describes a system of manufacture for a nano antenna constructed from a silicon base with aluminum or copper impurities doped into the silicon. application Ser. No. 11,683,056 further describes the integration of antenna and chip into one package.

Silicon chips are small rectangles of silicon. They are usually 4 or 5 square centimeters in area. The silicon acts as a base, or substrate, upon which the chip is built. It also plays a part in the electrical operation of the device. The chip is made up of a number of layers of pure and impure silicon which are built up on one side of the silicon rectangle. The lower layers interact to form the active components which are usually transistors. The upper layers are usually wires and are known as passive components.

Pure silicon is an insulator. During silicon wafer manufacturing impurities are added to the silicon base material as a layering process. This process is known as doping. The impurities which are added increase the number of free charge carriers or charged particles that are free to move about within the silicon. The result is that the silicon becomes progressively more electrically conductive as more impurity is added; Hence the name semi conductor. The type of impurity added affects the type of charge carrier. For example, some impurities generate free electrons which are negative charge carriers. This type of silicon is known as n-Type. They are others which generate holes or space where electrons should be. These particle spaces behave as positive charge carriers and are known as p-Type.

The current silicon manufacturing process uses technology referred to as “complementary metal oxide semiconductor”, also know as CMOS. During the CMOS process the embedded regions of the transistor form the source and drain for electron movement. The surface layers of the silicon wafer contain diffuse ions. These regions are often made from a mixture of silicon and metal. The metal has lower resistance allowing signals to travel faster. The insulator plate which goes between the silicon and the conducting plate is made of silicon oxide, also known as glass. The conducting plate or gate itself is poly crystalline silicon or “poly”. This part of the silicon is without a uniform crystal structure and can be distinguished from the silicon substrate on which the chip is placed.

The typical manufacturing process for silicon chips is to add layer upon layer of silicon with each layer comprising differing levels of electrical conductivity or circuit complexity. There are more electrically active layers which form the transistors. There are electrically passive components, for example wires, which connect transistors together. These differing layers are separated from each other by silicon oxide. Holes are made in the silicon oxide to make connections between the various layers. Furthermore, there are many wiring layers in modern chips. Traditionally, the metal used for wiring is aluminum or copper.

One of the key tools for integrated circuit manufacture is laser light. This is because lasers provide a key enabling technology for the semiconductor industry. They are used to inspect and repair the mask and wafer. Nanosecond and femtosecond diode pumped solid state lasers at 355 nm and 266 nm are used to inspect the circuits. They use repair tools which are designed to correct feature defects in the chrome absorber or quartz transmissive mask substrate patterns.

The mask (circuit) pattern is applied onto the silicon substrate layer by layer. The mask is made up of circuit features spun unto the surface of a polished silicon wafer. In layman’s terms, a very complicated circuitry is drawn at a very large macro level (room size) so that minute detail can be designed into an electronic circuit. This circuit is then photographed. The photograph, instead of being enlarged as is the normal in photography, is reduced in size. It is reduced to the size of the end of a pin needle. This reduced photograph is then photo exposed on a thin layer of photosensitive polymer which becomes part of the silicon mask. In more technical language the photolithographic detailed circuit is de-magnified replicating all features of the circuit perfectly. This is then made into a master stencil mask. It is illuminated in transmission by an ultraviolet light source. There is then a complex method of developing the de-magnified photograph through a process of photoresist, stripping, etching, ion implantation and deposition. After that, photo type exposures are repeated with different mask patterns as complex chip circuitry is built up, layer by layer, on the silicon wafers. The manufacturing process achieves size reduction in the photolithography mask imaging process by a combination of reducing the wavelength of the exposure source, increasing the resolution of the magnifying lens and using phase shifting masks. Furthermore, corrective structures to the mask features can be added and the photosensitive response of the resist can be tailored.

This invention contemplates taking the technology that is currently in use in the semiconductor industry and utilizing it to construct a precisely tuned antenna for RFID purposes. The precisely tuned antenna, when designed, would be photographed, reduced in size, and through a process of photolithography, well known to the semi conductor industry, plus deposition, etching and stripping, this precisely tuned antenna would be introduced onto a silicon wafer. This layer would be the reverse side of a layer of silicon which would have been treated by the femtosecond laser so that three dimensional nano structures on its surface would make it highly radiative.

These structures will be formed on the outside layer of a silicon chip. This will be accomplished through femtosecond laser ablation to commercial sheets of silicon. The outside edges of the treated silicon would then be highly receptive of electro magnetic radiation in the form of RFID electro magnetic signals. It is contemplated by this invention that these electro magnetic signals will emanate from an RFID interrogator. These treated sheets will be layered unto the circuitry of the chip as a final layer. The RFID interrogation signals would then impact the precisely tuned antenna etched into it making up the reverse side of the final layer of the silicon chip. In other words, the precisely tuned antenna is on the inside edge of the final layer of silicon treated with laser ablation. The reverse side, or outside edge, of this same layer of silicon has the three dimensional nano structures deposited onto it through the laser ablation process. Through the doping impurities of copper and aluminum introduced into the base silicon the antenna circuitry communicates with the surface of the silicon. This becomes the final layer of silicon layered onto the RFID transponder. The precisely tuned antenna then sends the electro magnetic interrogation signal to the transistors of the integrated circuit for processing. The information is backscattered to the interrogator through the radiating properties of the outside layer of impure silicon which is now acting as a radiating agent due to the laser ablation process.

The novelty in designing a precisely tuned antenna into a nano size is not so much in the manufacture but more in the propitious use of shorter electro magnetic signal wavelengths. These shorter wavelengths emanate from higher frequency electro magnetic signals. However, high frequency electro magnetic signals have a problem; they propagate poorly. Gigahertz level signals do not travel far as they are weakened by anything between the transmitter and receiver. This can include air. For example, the oxygen in the air resonates and strongly absorbs signals at about 60 gigahertz. However, in the 24 to 40 gigahertz range warehouse size transmission is not problematic.

The key utility of this invention is to reduce the cost of the most expensive add on feature to any RFID system. That is the antenna. Prior art antenna design stipulates that the antenna must be built and connected to the integrated circuits as an add on unit. This add on design requires wires and connectors and hands or machines to hook everything together. The integrated on chip antenna contemplated by this invention as an integrated package requires no external antenna, no wires and no expensive connectors.

Connections within the chip are accomplished through the aluminum and copper impurities introduced into the base silicon layer materials. The assembly is complete as a fully functioning integrated unit as soon as the integrated circuit leaves the chip foundry. The cost is only marginally higher than the integrated circuit as a stand alone as it involves the application of only one additional layer of silicon.

This invention proposes trimming the length of a very small antenna to correlate with a correspondingly high frequency range, for example, in the 24 gigahertz frequency range. The shorter wavelengths of these higher frequency signals allow for a smaller antenna which will still resonate with the interrogating electro magnetic signal. For example, the 24 Gigahertz range is 10 times faster than the frequency used by a home computer or a micro wave oven. Although gigahertz signals do not propagate well there are opportunities for propagation. For example gigahertz electro magnetic signals propagate efficiently in smaller, defined environments such as within a warehouse or distribution center.

This invention contemplates following on from previous Rodgers' Applications which describe a system of retransmitting cellular telephone remote inquiries into a proprietary transformed signal which is locked into the interrogating environment. The electro magnetic signals are also magnified within the environment. Specifically, this invention is to be a follow on from application Ser. No. 11,683,056, "RFID silicon antenna" which describes a system of manufacture for an integrated nano antenna constructed from a silicon base with aluminum or copper impurities doped into the silicon. Furthermore, this invention is to be read in conjunction with application Ser. No. 11,678,063, "External antenna for RFID remote interrogation" which describes an antenna external to a warehouse, distribution center or retail environment, which captures remote cellular telephone microwave interrogations and re-radiates them within the environment on any frequency. This invention is also to be read in series with application Ser. No. 11,672,525, "RFID environmental manipulation" which contemplates injecting aluminum oxide into a warehouse or distribution center environment so that electro magnetic signals are enhanced yet, at the same time, contained within the environment.

The present invention piggy backs on the current trend in the semiconductor industry towards System on Chip (SoC) and System on Package (SoP) concepts. These concepts refer to putting all items necessary for chip operation within the chip itself. This invention relates to the RFID industry in particular and its requirements for a miniature antenna to form an integral part of the transponder item found in a complete RFID system. Through integration of the antenna, processors, memories, logic gates and biasing circuitry into a single semiconductor chip, the manufacturing process outlined herein details commercial transponder advantages of size, weight and cost. In other words, by manufacturing the antenna as part of the chip and not by attaching an external antenna, the cost decreases as does the size and weight of the RFID transponder. Furthermore, the present invention borrows from Gen 2 cellular telephony designs by incorporating a frequency division concept into this novel RFID transponder formula. By way of explanation, the 2 G cellular system of frequency division multiple access (FDMA) separates the cellular spectrum into hundreds of distinct voice channels. For example, this is accomplished by splitting the federally assigned bandwidth into distinct and uniform chunks of bandwidth. This is analogous to several radio stations within a large city. Each station broadcasts on its own distinct frequency within an assigned FCC band range. In the FDMA system each telephone call is separated by 45 MHz. Therefore, one call would transmit at 893.7 MHz and another at 824.04 MHz so that the two calls do not offend each other by broadcasting on identical frequencies. Likewise, this invention proposes that each category of articles to be traced by the RFID system have transponders embedded or attached to them which broadcast at frequencies which are 2 MHz apart.

The different broadcasting frequencies would be a function of antenna tuning. This tuning would be accomplished by precisely designing each resonant sub frequency into an antenna template. This template would be photo reduced and etched unto a silicon substrate. The transponder antenna template would be tested and then the template would be trimmed to perfection using laser technology. It is contemplated by this invention that the first transponder as manufactured in bulk from the initial template will resonate at 24 GHz as so tuned during the manufacturing process. As an example, this transponder would be assigned to the category "television" in a supply chain. A second set of transponders would be manufactured using the identical semiconductor type manufacturing process to resonate at 24.002 GHz. This would be assigned the category "radio" in a supply chain. Then a third set of transponders would be manufactured using the identical semiconductor process to resonate at 24.004 GHz. This would be assigned the category "CD player" in a supply chain, and so forth. The increment is by 2 MHz, the amount which was found to be scientifically replicable using laser trimming in the Leisten et al. study. Therefore, there are thousands of 2 MHz increments between 24 GHz and 40 GHz available for assignment to different categories in a supply chain where this RFID invention is used as a proprietary system.

This inventive process transfers the smart aspect of tuning from the interrogator to the transponder. In so doing this invention obviates the need for anti collision algorithms. Each category transmits at a unique frequency. In so doing, there is much less collision in the atmosphere of the warehouse or distribution center. For example, a standard RFID system in interrogator mode would transmit at one center spectrum frequency for all categories. This standard process jams the conductive airways of a warehouse or distribution center with many unwanted responses from transponders which are not being specifically interrogated. It also clogs the middle ware with a plethora of unnecessary data. This invention allows each product category on the supply chain to be interrogated as a separate category and at a specific category frequency. Within that very specific frequency each item in a category would have a unique identifier number to backscatter to the interrogator.

As the antenna is manufactured into the chip, the entire package is exponentially smaller than any currently produced RFID transponder. The current RFID industry standard transponder usually has an external antenna attached to the chip. Pursuant to this invention the antenna is miniaturized using standard integrated circuit manufacturing techniques. However, the smaller antenna dictates that the transponder operate at a much higher frequency. This is because as the antenna gets smaller the wavelength that it can resonate with also gets smaller. As the frequency increases the wavelength decreases.

Precisely tuning the antenna is done in the template design stage. Each template is designed so that each antenna produced will resonate with one exact frequency. This template is then photo reduced. The photo reduction is then made into a mask. This mask is fabricated unto a silicon layer which is laid upon the silicon substrate. Then another template is made designed to resonate at exactly 2 MHz distance apart from the first template, and so on. Each template produces a test batch of antennas which are examined with a laser and trimmed to perfection. The template is then re designed to match the trimmed antenna. According to this invention a batch of unlimited number of precisely tuned nano antennas can be manufactured from one template and, by using economies of scale, cost decreases will result due to volume production.

The operational range of a 24 GHz signal is warehouse size. A system with warehouse size range would use 40 microwatts of power by using short duty cycles. In other words, the transmitter on the interrogator sends out only brief pulses. This makes the average power consumption miniscule.

The 24 GHz signal would need to be contained within the warehouse or distribution center environment as this frequency is not mandated for RFID use. The use of the GHz signal would need to be used in a proprietary RFID system. However, this is feasible through use of Rodgers application Ser. No. 11,672,525, "RFID environmental manipulation" which contemplates injecting aluminum oxide into a warehouse or distribution center environment so that electro magnetic signals are enhanced yet, at the same time, contained within the environment. The enhancement feature obviates the propagation problems inherent in gigahertz transmissions while the containment properties of aluminum oxide ensure that these electro magnetic gigahertz transmissions are kept private and proprietary.

The useful, non-obvious and novel steps of this invention include the integration of a precisely tuned silicon based antenna into the silicon chip manufacturing process. According to this invention RFID transponder antennas are mass produced from templates. The templates vary in length and are designed to replicate antennas which resonate at precise frequencies. The length of each antenna template is determined by laser measurement and trimming algorithms. This system allows for precise tuning of an antenna to a distinct category of product within a supply chain. The result is smaller and less costly RFID transponders which weigh less than prior art RFID transponders. This system also reduces signal to noise ratio by providing a gatekeeper function in relationship to ambient interference which is directly correlated to the precise tuning of the RFID transponder antenna.

The invention claimed is:

1. A method of manufacturing a Radio Frequency Identification (RFID) transponder integrated circuit package incorporating a precisely tuned antenna comprising: providing at least one substrate, each substrate including at least one silicon layer; at least one semiconductor template, also known as a die; constructing an antenna of doped silicon layered into said integrated circuit package using a photoresist manufacturing process; designing, photographing and de-magnifying the antenna to produce a template or die and whereby said template or die is designed to mass produce a RFID antenna which is part of an integrated circuit package with a precise electro magnetic signal which resonates or tunes in the 24 to 40 GHz (gigahertz) range; laser trimming the antenna template or die to resonate or tune in 2 MHz (megahertz) increments from the 24 GHz (gigahertz) frequency to the 40 GHz (gigahertz) frequency; precisely trimming the antenna template or die to a specific frequency using algorithms; testing the frequency resonance of the mass produced antennas which are integrated into a single packed integrated circuit all for the purpose of reducing the size, weight and cost of a RFID transponder while increasing efficiency by reducing the transponder's signal to noise ratio; complementing the RFID transponders with RFID interrogators designed to frequency switch within the 24 to 40 GHz (gigahertz) range as desired by an operator or operating system.

2. A method of manufacturing an integrated circuit package as defined in claim 1, wherein the integrated circuit package is manufactured using standard silicon wafer integrated circuit manufacturing methodology with the addition that the antenna template or die be manufactured using the methodology more precisely described as production of a photolithographic detailed and precisely tuned antenna template or die which is de-magnified replicating all features of the precisely tuned antenna perfectly, producing a de-magnified photographic replica; the replica is then manufactured into a master stencil mask and illuminated in transmission by an ultraviolet light source after which the de-magnified photographic replica is etched and deposited through a process of photoresist onto a silicon layer for application to an integrated circuit substrate.

3. A method of manufacturing and integrated circuit package as defined in claim 1, wherein the precisely tuned antenna is designed so that the antenna length is such that any antenna can be tuned at each of 24 GHz (gigahertz) and then in 2 MHz (megahertz) increments up to and including the 40 MHz (gigahertz) frequency of electro magnetic signals.

4. A method of manufacturing and integrated circuit package as defined in claim 1, wherein the precisely tuned antenna template or die is trimmed using a positive electrophoretic photoresist and UV eximer laser mask to produce precise conducting features on the surface of the antenna template or die with a laser trimming technique guided by trimming algorithms to machine the antenna template or die to within a tolerance of 2 megahertz using an Nd; YAG laser in TEM00 mode focused onto the antenna template or die by means of a flat field (f-theta) lens and scanned across the top surface of the antenna by means of an x-y galvanometer.

5. A method of manufacturing an integrated circuit package as defined in claim 4, whereby the YAG laser in TEM00 mode is integrated into a robotic assembly loop whereby a robot picks and places the antenna template or die with a fitted matching box in a pneumatically actuated chuck on a high speed linear stage which moves the antenna template or die into a laser safe trimming tool enclosure with a pneumatically operated door.

6. A method of manufacturing an integrated circuit package as defined in claim 5, whereby further four resonant frequency probes are positioned radially around the antenna template or die and are moved to close proximity of the antenna template or die perimeter such that each probe is located at the base of the antenna template or die.

7. A method of manufacturing an integrated circuit package as defined in claim 6, whereby further the resonant frequency and balance (impedance) of the antenna template or die is measured with the resonant frequency probes as well as with a network analyzer.

8. A method of manufacturing an integrated circuit package as defined in claim 7, whereby further measurements taken by the probes and network analyzer use trimming algorithms which determine the amount of copper or aluminum needed to be added or removed from the antenna template or die so that antennas mass produced from the template or die will resonant at a precise frequency in gigahertz designated for the template or die.

9. A method of manufacturing an integrated circuit package as defined in claim 8, whereby subsequent to the trimming, the antenna template or die is inspected with laser light using nanosecond and femtosecond diode pumped solid state lasers at 355 nm and 266 nm to determine if the antenna template or die is within a 2 megahertz tolerance and if so, laser marking the antenna template as within accepted tolerances.

10. A method of manufacturing an integrated circuit package as defined in claim 1, whereby the template or die is used to mass produce a layer of silicon, doped with aluminum or copper, which acts as a RFID transponder antenna for full integration with a silicon chip in which mass produced RFID antennas operate within a 2 megahertz tolerance.

11. A method of manufacturing a Radio Frequency Identification (RFID) transponder integrated circuit package incorporating a precisely tuned antenna comprising: providing at least one substrate, each substrate including at least one silicon layer; at least one semiconductor template, also known as a die; constructing an antenna of doped silicon layered into said integrated circuit package using a photoresist manufacturing process; designing, photographing and de-magnifying the antenna to produce a template or die and whereby said template or die is designed to mass produce a RFID antenna which is part of an integrated circuit package with a precise electro magnetic signal which resonates or tunes in the 24 to 40 GHz (gigahertz) range; laser trimming the antenna template or die to resonate or tune in 2 MHz (megahertz) increments from the 24 GHz (gigahertz) frequency to the 40 GHz (gigahertz) frequency; precisely trimming the antenna template or die to a specific frequency using algorithms; testing the frequency resonance of the mass produced antennas which are integrated into a single packaged integrated circuit all for the purpose of reducing the size, weight and cost of a RFID transponder while increasing efficiency by reducing the transponder's signal to noise ratio; complementing the RFID transponders with RFID interrogators designed to frequency switch within the 24 to 40 GHz (gigahertz) range as desired by an operator or operating system so that the RFID interrogators resonate to an exact electro magnetic signal frequency in gigahertz as assigned to each category of product to be tracked in a warehouse, distribution center, retail environment or within a supply chain.

* * * * *